US007991369B2

(12) United States Patent
Nutt

(10) Patent No.: US 7,991,369 B2
(45) Date of Patent: Aug. 2, 2011

(54) REDUCING POWER DISSIPATION USING PROCESS CORNER INFORMATION

(75) Inventor: Timothy Nutt, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1345 days.

(21) Appl. No.: 11/527,437

(22) Filed: Sep. 26, 2006

(65) Prior Publication Data
US 2008/0076372 A1 Mar. 27, 2008

(51) Int. Cl.
*H04B 1/24* (2006.01)

(52) U.S. Cl. ........................ 455/130; 455/226.1; 455/541

(58) Field of Classification Search .................. 455/130, 455/136, 126.1, 226.1, 67.11, 214, 245, 296, 455/230, 234, 127.1, 334, 336; 327/170, 327/530, 534, 535, 536, 541
See application file for complete search history.

(56) References Cited

U.S. PATENT DOCUMENTS

| 5,021,684 | A  | * | 6/1991 | Ahuja et al. | 327/541 |
| 6,778,117 | B1 |   | 8/2004 | Johnson | 341/144 |
| 7,355,467 | B2 | * | 4/2008 | Waldstein et al. | 327/530 |
| 7,362,129 | B1 | * | 4/2008 | Rahman | 326/30 |
| 7,368,940 | B1 | * | 5/2008 | Schultz | 326/38 |
| 7,504,876 | B1 | * | 3/2009 | Raghavan et al. | 327/536 |
| 7,521,975 | B2 | * | 4/2009 | Biesterfeldt et al. | 327/170 |
| 7,529,993 | B1 | * | 5/2009 | Schultz | 714/725 |
| 2004/0169773 | A1 |   | 9/2004 | Johnson | 348/731 |

* cited by examiner

*Primary Examiner* — Tony T Nguyen
(74) *Attorney, Agent, or Firm* — Trop, Pruner & Hu, P.C.

(57) ABSTRACT

In one embodiment, the present invention includes a method for determining process corner information of an integrated circuit (IC) and controlling at least one analog current for at least one analog circuit of the IC based on the process corner information. More specifically, if the process corner information is indicative of a fast corner IC, the analog current may be scaled down. At the same time that the analog current is scaled down, a current consumption level of digital circuitry of the IC may increase. In this way, overall power consumption of the IC may be reduced to the extent that the analog current(s) are scaled.

18 Claims, 5 Drawing Sheets

US 7,991,369 B2

REDUCING POWER DISSIPATION USING PROCESS CORNER INFORMATION

FIELD OF THE INVENTION

Embodiments of the present invention relate to semiconductor devices, and more particularly to controlling power dissipation in such devices.

BACKGROUND

Semiconductor devices are being developed that include great amounts of circuitry in ever-decreasing areas. Such circuitry, as measured in transistor counts and other components, increases in every product generation. Furthermore, devices are fabricated according to smaller technologies. Many of today's semiconductor devices are formed at process geometries of 130 nanometers (nm) and lower, and this trend continues as other products are introduced at ever smaller geometries.

As a result, greater amounts of functionality can be present in a single semiconductor package. The circuitry present in such a package can require significant amounts of power for its small size. For example, for a given device to achieve a desired level of performance, a relatively high power consumption can be required. By consuming higher power, the semiconductor package is subjected to high heat conditions, oftentimes in excess of 125 degrees. Such high temperatures can negatively affect reliability of the semiconductor device. At the same time, smaller process technologies enable the package to become very small, which allows less heat to be conducted away from the semiconductor device within the package. Accordingly, the amount of power that can be consumed by the semiconductor device can be limited by heat factors. Furthermore, for devices that operate on battery power, reduced power consumption enables longer operating times.

A consideration in designing integrated circuits (ICs) is process variations that occur in fabrication. That is, individual wafers of a given lot, and even individual dice on a wafer, can have varying process capabilities. Accordingly, design methodologies typically incorporate so-called process corners, which are used to simulate best case/worst case scenarios. For example, simulations can be run in design of integrated circuits to model the circuitry for fast process corners and similarly for slow process corners with respect to timing issues and so forth. Typically, circuitry is designed such that the transistors and other components are sized to meet timing and other budgets in case of a slow process corner device.

However, when actual semiconductor devices are fabricated that have a fast variation, the circuitry, especially digital circuits on the device, consumes greater power. A need thus exists to improve power dissipation in semiconductor devices.

SUMMARY OF THE INVENTION

In one aspect, the present invention includes a method for determining process corner information of an integrated circuit (IC) and controlling at least one analog current for at least one analog circuit of the IC based on the process corner information. More specifically, if the process corner information is indicative of a fast corner IC the analog current may be scaled down. At the same time that the analog current is scaled down, a current consumption level of digital circuitry of the IC may increase. In this way, overall power consumption of the IC may be reduced to the extent that the analog current(s) are scaled. In one embodiment, the analog current may be controlled by digitizing the process corner information, and controlling a current generator based on the digitized information.

Another aspect of the present invention is directed to an IC that includes one or more digital and analog circuits, a detector to determine process corner information of the IC, and a current generator to generate an analog current for the analog circuit(s). The current generator may provide the analog current at a nominal level if the process corner information is indicative of a slow process corner and at a reduced level if the process corner information is indicative of a fast process corner. In one embodiment, the detector may include a reference circuit to output a reference voltage indicative of the process corner information. Further, the current generator may include multiple current mirrors to generate different analog currents, where each of the current mirrors may have a controllable ratio controlled by a control value representative of the process corner information, e.g., obtained from the reference voltage.

Yet another aspect of the present invention is directed to a system that includes a tuner to receive an incoming radio frequency (RF) signal including content and provide a tuned channel output. In some implementations, the tuner may be a mixed signal device including a detector to determine process corner information of the mixed signal device and a current generator to generate an analog current for at least one analog circuit of the mixed signal device. The current generator may be configured to provide the analog current at a scaled level if the process corner information is indicative of a fast process corner. The system may further include, in one embodiment, a demodulator coupled to the tuner to demodulate the tuned channel output and an output device such as a display coupled to the demodulator to provide the content. In many implementations, the mixed signal device may include digital circuitry that consumes greater power at the fast process corner than at a slow process corner. By configuring the current generator to scale the analog current(s) when sufficient margin exists to do so, a reduced standard deviation for a power dissipation level of a product incorporating the tuner can be realized

DETAILED DESCRIPTION

Figure 1:
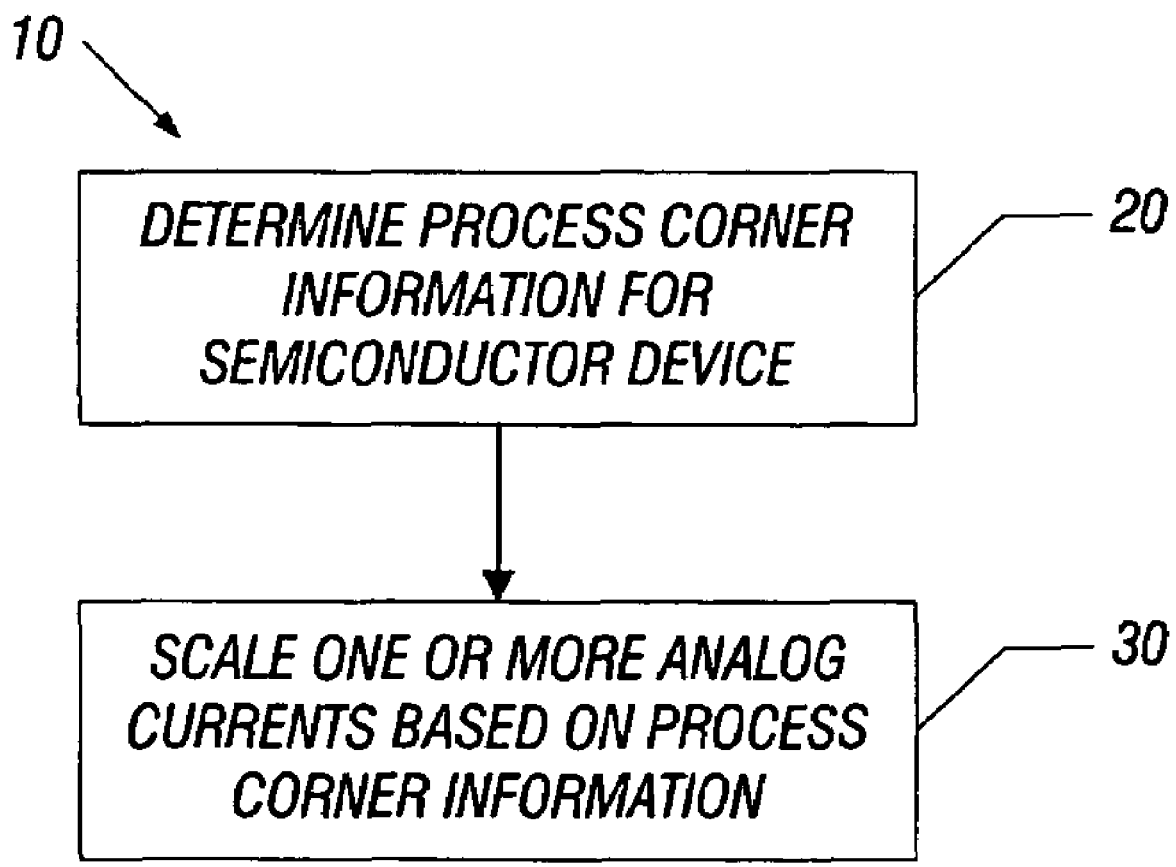
FIG. 1 is a flow diagram of a high level view of a technique in accordance with one embodiment of the present invention.

Embodiments of the present invention may be used to detect a process corner at which a semiconductor device is operating. That is, embodiments may be used to determine process corner information for a given integrated circuit (IC).

Using this information, at least analog currents used in the chip may be controlled accordingly. As will be described further below, various manners of detecting process corner information and controlling circuitry of the IC accordingly may be realized.

Furthermore, it is to be understood that embodiments of the present invention may be implemented in many types of semiconductor devices. For example, some implementations may be used in mixed signal semiconductor devices including both analog and digital circuitry. As one example, the IC may be a television tuner such as a single-chip tuner that is coupled to receive an incoming signal from an over-the-air source or another such source. Other implementations may be present in other types of tuners, such as a satellite television tuner. Still further implementations may be used in wireless devices, such as wireless transceivers, among many other integrated circuits.

In various implementations, process corner information may be obtained dynamically or adaptively, e.g., while a chip is operating. In other implementations, process corner information may be obtained during device characterization and stored, e.g., in non-volatile memory or another location to enable control according to the stored information. Control methods may be implemented in hardware, software, firmware or combinations thereof. For example, a purely analog control technique may be implemented in some embodiments. In others, a combination of analog and digital circuitry may be used to detect process corner information and control power dissipation accordingly. Still further, embodiments may implement some amounts of software to enable power dissipation control.

Using embodiments of the present invention, power dissipation of an integrated circuit may be reduced if such a device is capable of trading off performance for power. That is, embodiments may enable a device to adaptively reduce its power consumption based on its actual process variation. For example, if a device is of a sufficient process corner to enable it to scale back at least its analog current consumption and still meet required operational parameters, power consumption may be reduced. Thus when there is sufficient margin given the actual process variation of the chip, various scaling techniques may be implemented. That is, because ICs are typically designed to ensure sufficient performance with slow process transistors, extra performance margin may be present if the process variation of the actual chip indicates presence of fast process transistors.

Typically, analog circuitry of a chip may operate at a substantially constant power consumption level regardless of actual process corner of the chip. In contrast, digital circuitry of the chip can consume different amounts of power depending on process corner. That is, a fast corner device will generally consume greater power in its digital circuitry, while the same digital circuitry of a slower corner device will consume less power.

In the context of a manufacturer of semiconductor devices, a given chip may be specified to operate over a range of power consumptions, from a low end to a high end (i.e., min to max), with a typical or nominal consumption level therebetween. The difference between the low and high ends may correspond to a standard deviation due to process corners of actual devices, while the nominal level may correspond to a mean between these low and high ends. Using embodiments of the present invention, a standard deviation of a chip, e.g., as represented in a manufacturer's datasheet, may be reduced while the mean or nominal level may remain the same. In other words, excursions from the mean for a given chip may vary over a smaller range, as when a chip is of a fast process corner, analog currents may be reduced to compensate for the greater power consumption by the digital circuitry. While the scope of the present invention is not limited in this regard, many embodiments may be implemented in ICs that include at least a certain amount of digital circuitry. For example, a chip having at least, for example, 30-40% (and even more) of its area devoted to digital circuitry may benefit from the embodiments disclosed herein.

In embodiments in which the IC is a mixed signal device, the process corner information may be used to scale only the analog currents, i.e., the currents used to control analog circuitry of the chip. In this way, analog power may be traded against digital power, as the digital components of the chip may consume power at a given level depending on actual process corner of the chip.

Referring now to FIG. 1, shown is a flow diagram of a high level view of a technique in accordance with one embodiment of the present invention. As shown in FIG. 1, method 10 may begin by determining process corner information for a given semiconductor device (block 20). For example, a reference circuit may be present in the device to detect the process corner of the device. In one embodiment, the reference circuit may determine a threshold voltage for a transistor of a given size. This threshold voltage may act as a reference voltage indicative of the process corner of the chip and may also be used to develop at least some, if not all, analog currents to be used on chip.

Accordingly, with reference back to FIG. 1, based on the process corner information obtained in block 20, one or more analog currents of the semiconductor device may be scaled accordingly (block 30). Note that by scaling (i.e., reducing) analog currents, power dissipation decreases linearly. While described at this high level in the embodiment of FIG. 1, it is to be understood that many other steps may be taken in controlling power dissipation. For example, in some embodiments at least some amounts of digital circuitry may be similarly controlled, e.g., based on the reference voltage determined that is indicative of the process corner at which the chip is operated.

Figure 2A:
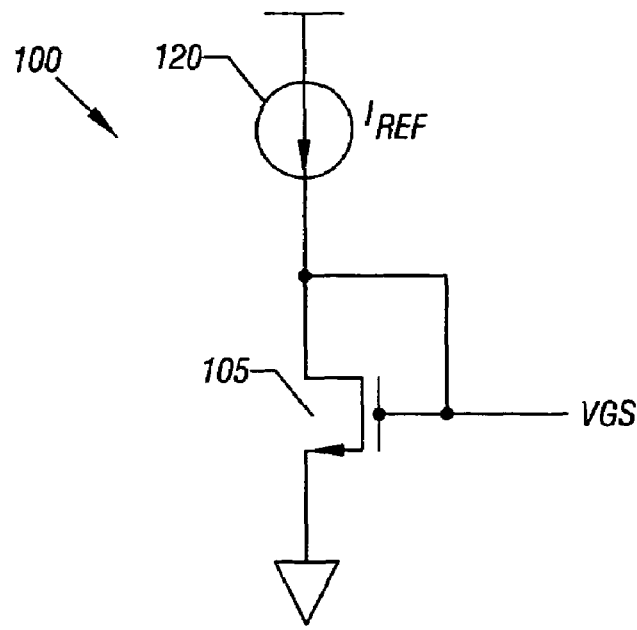
FIG. 2A is a schematic diagram of a detector in accordance with one embodiment of the present invention.

As discussed above, various manners of determining process corner of a particular device can be realized. Referring now to FIG. 2A, shown is a schematic diagram of a detector in accordance with one embodiment of the present invention. As shown in FIG. 2A, circuit 100 includes an n-channel metal oxide semiconductor field effect transistor (nMOSFET) 105 that is diode-connected, i.e., commonly coupled gate and drain terminals that are coupled to a current source 120, which may be a reference current, $I_{REF}$. Using circuit 100, the gate-to-source voltage ($V_{GS}$) of MOSFET 105 may be determined. This voltage is proportional to process corner and temperature. Accordingly, based on the process corner of a given chip on which circuit 100 is located, it may be determined whether the chip is of a fast or slow process corner by analysis and/or use of this threshold voltage.

Figure 2B:
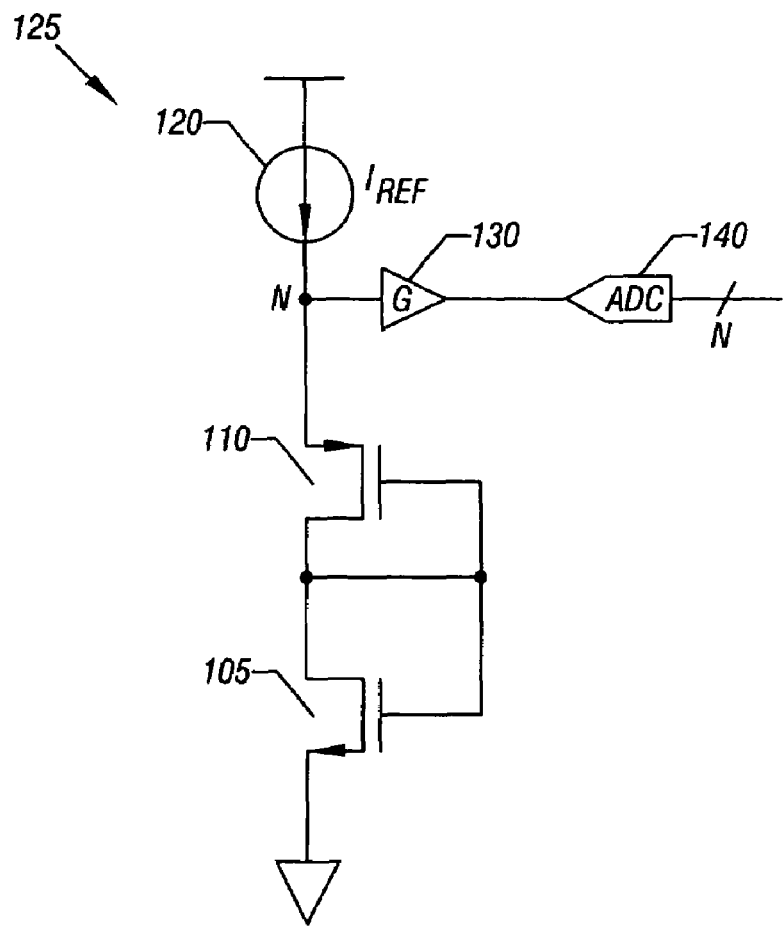
FIG. 2B is a schematic diagram of a detector in accordance with another embodiment of the present invention.

Note that various implementations of a process corner detector may be realized. Referring now to FIG. 2B, shown is a schematic diagram of a different process corner detector. As shown in FIG. 2B, circuit 125 may generally correspond to a MOSFET inverter, with a pair of MOSFETs, namely n-channel MOSFET 105 that is coupled to a p-channel MOSFET 110 both having gate and drain terminals commonly coupled. Further, current source 120 is coupled to a source terminal of MOSFET 110 at a node N. In this embodiment, the process corner information may be detected at node N. This node N may correspond to a threshold voltage, namely a gate-to-source voltage for both the n-channel and p-channel devices (i.e., $V_{GSP}+V_{GSN}$). Because this threshold voltage varies based on process, circuit 125 may be used to detect process variations. That is, the threshold voltage is lower on fast corner devices, and is higher on slower process corner devices, as threshold voltage is strongly dependent on process corner. Thus based on the threshold voltage of the transistors of detector circuit 125, the process corner information is derived.

Referring still to FIG. 2B, note that in some embodiments the threshold voltage may be further processed, e.g., to improve performance via signal conditioning and dynamic range of the information. Specifically, as shown in FIG. 2B, the threshold voltage at node N may be input into an amplifier 130 having a gain, G. In turn, amplifier 130 may be coupled to an analog-to-digital converter (ADC) 140, which digitizes the reference voltage to obtain an N-bit digitized representation of the reference voltage. As will be described further below, this digitized information may be stored, e.g., in a register, non-volatile memory or other location within the IC and then used to control, at least analog currents of the IC. Note that the current source used in FIGS. 2A and 2B can vary in different embodiments. For example, in some implementations a proportional to absolute temperature (PTAT) current may be used for a current source. Note that in embodiments in which a PTAT current is used, temperature effects may be removed from the process corner detector. Accordingly, a reference voltage may be proportional to process, and not temperature. In other embodiments, different manners of generating a current source may be realized.

Figure 3A:
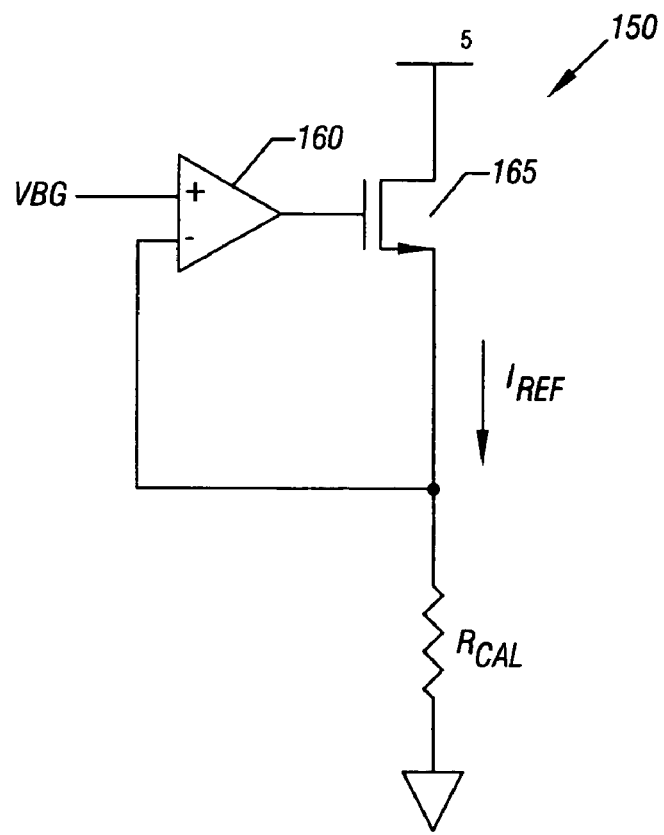
FIG. 3A is a schematic diagram of an example circuit for generating a reference current in accordance with an embodiment of the present invention.

Referring now to FIG. 3A, shown is an example circuit for generating a current source in accordance with an embodiment of the present invention. As shown in FIG. 3A, circuit 150 includes an operational amplifier (op-amp) 160 that receives a reference voltage, e.g., a bandgap voltage that is process, voltage and temperature (PVT) independent. The other input to op-amp 160 is a feedback signal from a source terminal of an nMOSFET 165 coupled to the output of op-amp 160. Also coupled to the source terminal is a calibration impedance, namely $R_{CAL}$. Accordingly, the reference current, $I_{REF}$ is generated through this calibration resistance $R_{CAL}$. In the embodiment of FIG. 3A, $I_{REF}$ may be derived as $V_{BG}$ divided by $R_{CAL}$, where $V_{BG}$ is a process/temperature independent bandgap voltage and $R_{CAL}$ is a calibrated resistor. Thus in this embodiment the reference current may be a process/temperature/power supply independent source. Using this current source, the reference voltage generated in FIGS. 2A and 2B may be generated proportional to process corner. Note that in some embodiments the $R_{CAL}$ resistor may vary over process and possibly also over temperature.

Figure 3B:
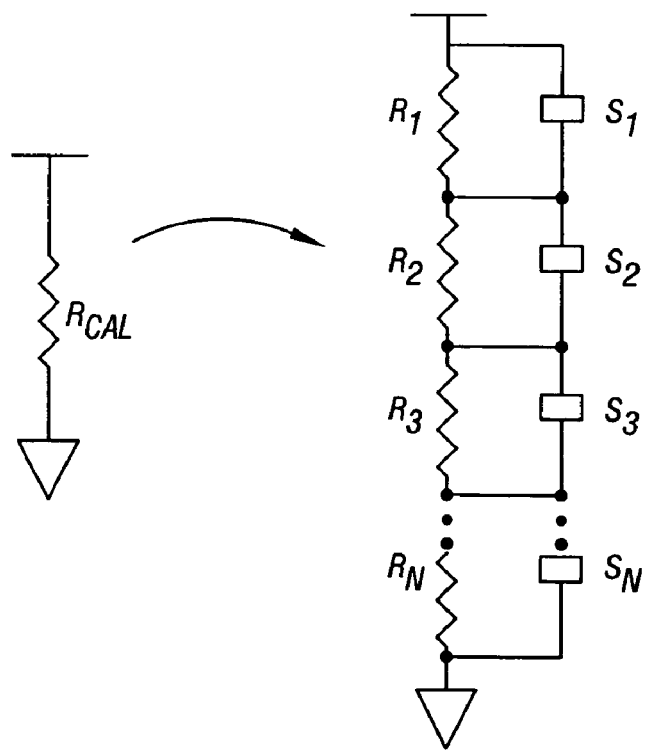
FIG. 3B is a schematic diagram of an example circuit for generating a reference current in accordance with another embodiment of the present invention.

In various embodiments, the calibration resistance may be implemented using a digital-to-analog converter (DAC), where a plurality of series resistors are each coupled in parallel with controllable switches. Thus as shown in FIG. 3B, $R_{CAL}$ may take the form of a plurality of series-coupled resistors $R_1$-$R_N$, each having a corresponding switch $S_1$-$S_N$ coupled in parallel therewith. In various embodiments, switches $S_1$-$S_N$ may be controlled by digital control bits, e.g., N-bits. The reference current thus generated in the embodiment of FIG. 3A may be used in a given reference circuit, such as those in FIGS. 2A and 2B. Furthermore, a reference voltage generated as in FIGS. 2A and 2B from this reference current may be used to generate additional analog currents for use throughout the chip.

Different manners of controlling analog currents may be realized. For example, in some embodiments digital control information, e.g., based on the digitized reference voltage may be used. For example, the digitized voltage may be converted to a 2-bit representation that thus accommodates four levels of current consumption. For example, the four levels may correspond to a nominal current consumption and −10, −20, and −30% variances, respectively from the nominal value. For example, a digital value of 00 may correspond to the nominal value, while a digital value of 11 may correspond to the −30% representation, although the scope of the present invention is not limited in this regard.

The reference voltage obtained by circuits 100 or 125 of FIG. 2A or 2B may be used to control currents generated for analog circuitry of the chip. That is, the reference voltage may be input into a current generator of the chip that may generate on-chip currents for all analog circuitry. The reference voltage generated may be used to control analog currents in various ways. For example, a current generator may incorporate a current mirror, although other implementations are possible. In other implementations, the reference current itself may be used to generate analog currents.

Figure 4:
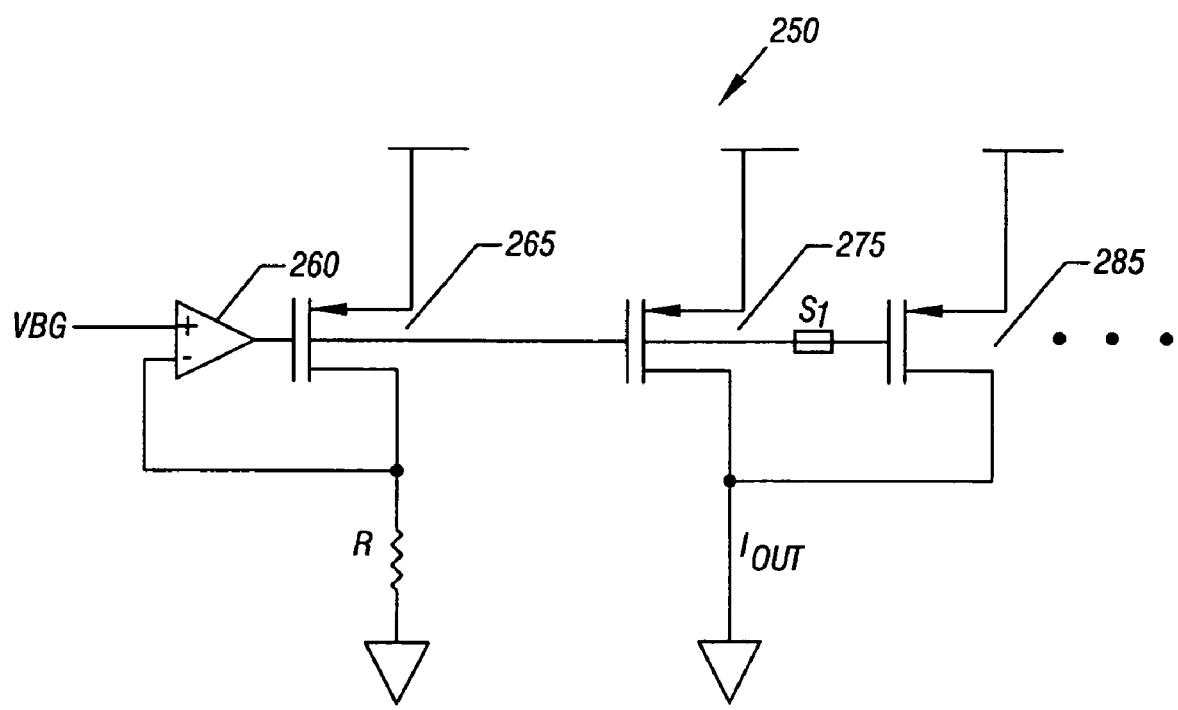
FIG. 4 is a schematic diagram of a current generator in accordance with one embodiment of the present invention.

Referring now to FIG. 4, shown is a current generator in accordance with one embodiment of the present invention. As shown in FIG. 4, current generator 250 includes an op-amp 260 coupled to receive a bandgap voltage $V_{BG}$. Furthermore, the output of op-amp 260 may be coupled to gate terminals of multiple p-channel MOSFET devices each having a different size. As shown in FIG. 4, MOSFETs 265, 275, and 285 may be coupled as a current mirror with drain terminals coupled to provide an output current, $I_{out}$. In various embodiments, each of MOSFETs 265, 275 and 285 may be of different sizes such that different current outputs can be generated based on the number of transistors switched into the circuit. That is, based on, e.g., digital control, i.e., N-bits, such as that generated in FIG. 2B, one or more switches (i.e., S1 shown in the embodiment of FIG. 4) may be controlled to either switch in or switch out one or more additional transistors to thereby scale the output current, $I_{OUT}$. Thus, the ratio of the current mirror may be controlled, e.g., via digital bits from a control word generated by the reference voltage of FIG. 2B (for example). Accordingly, the digitized reference voltage may be used to control the ratio of the current mirror, and thus the output current that is provided to analog circuitry of the chip. While shown with only a single current mirror in the embodiment of FIG. 4, it is to be understood the scope of the present invention is not so limited, and multiple current mirror stages may be present to provide different output currents to different analog circuitry of the chip.

Figure 5:
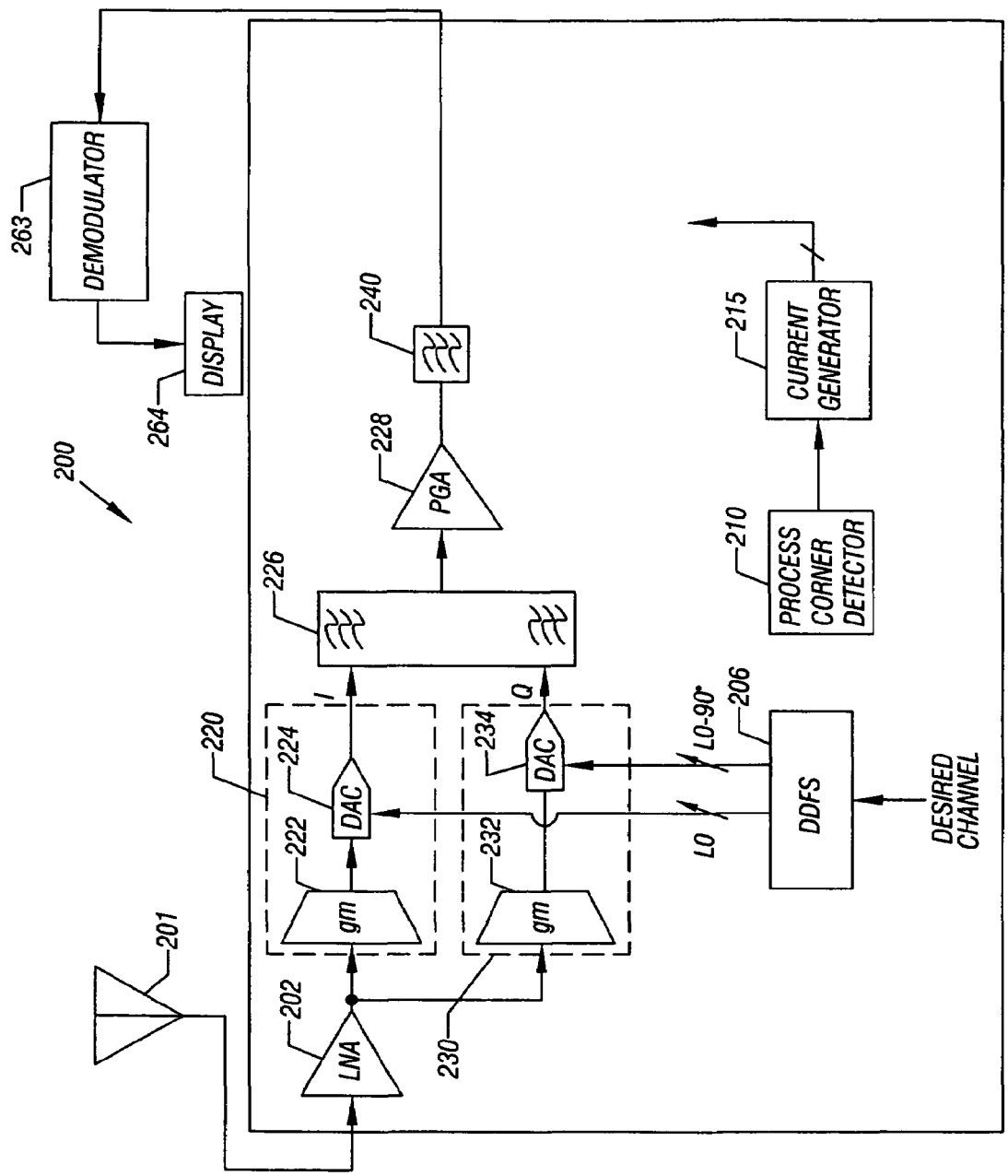
FIG. 5 is a block diagram of a system in accordance with one embodiment of the present invention

Embodiments of the present invention may be implemented in many different system types. As described above, applications may include mixed signal circuits that include both analog and digital circuitry. Referring now to FIG. 5, shown is a block diagram of a system in accordance with one embodiment of the present invention. As shown in FIG. 5, system 200 may be a television that is coupled to receive a RF signal from an antenna source, cable distribution, or other source. The incoming RF signal may be provided to a television tuner 203 which may be, in one embodiment a single-chip mixed signal device. Television tuner 203 may incorporate embodiments of the present invention to enable control or scaling of analog currents used within tuner 203, while digital circuitry consumes power at a rate based on process corner.

Thus as shown in FIG. 5, tuner 203 includes a process corner detector 210 that may be used to determine a process corner of the device during operation. Information based on the process corner may be communicated to a current generator 215, which may in turn generate one or more analog currents for powering analog circuitry of tuner 203.

Referring still to FIG. 5, tuner 203 includes a low noise amplifier (LNA) 202 to receive and amplify the RF signal from an antenna 201. Tuner 203 further includes a direct digital frequency synthesizer (DDFS) 206, mixers 220 and 230, a polyphase filter 226, a programmable gain amplifier (PGA) 228, and a bandpass filter 240.

In operation, LNA 202 may receive and amplify an RF input signal. Mixers 220 and 230 may receive the output of LNA 202 and DDFS 206 may receive a tuning signal, namely a desired channel signal and provide digital local oscillator signals labeled "L0" and "L0-90°." Mixer 220 is coupled to receive the output of LNA 202 and L0, and provide an in-phase intermediate frequency (IF) signal, "I." In the implementation of FIG. 5, mixer 220 includes a transconductance amplifier 222 and a DAC 224. Mixer 230 is coupled to receive the output of LNA 202 and L0-90°, and provide a quadrature-phase IF signal, "Q." In the implementation of FIG. 5, mixer 230 includes a transconductance amplifier 232 and a DAC 234.

From mixers 220 and 230, the I and Q signals may be provided to a polyphase filter 226, which may act as a complex filter to thus combine the I and Q signals into a complex IF signal. This complex IF signal may be provided to a PGA 228, which may provide varying amounts of gain, e.g., responsive to an automatic gain control (AGC) circuit (not shown in the embodiment of FIG. 5). The conditioned signal may be filtered in bandpass filter 240, the output of which may be provided off-chip.

Referring still to FIG. 5, the IF output of tuner 203 may be provided to additional processing circuitry within television 200, such as a demodulator 263 and associated circuitry to enable a processed television signal to be provided to a display 264. While shown with this particular implementation in the embodiment of FIG. 5, it is to be understood the scope of the present invention is not limited in this regard. Furthermore, it is to be understood that embodiments may be implemented in many different devices, such as receivers, transmitters and so forth.

Accordingly, using various embodiments one or more analog output currents can be generated in a common current generator, with reduced power dissipation if a given chip is of a faster process corner (e.g., a reference voltage that controls the current generator is lower).

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   determining process corner information of an integrated circuit (IC); and
   controlling at least one analog current provided to at least one analog circuit of the IC based on the process corner information, including generating from a reference voltage a plurality of analog currents for different analog circuits, wherein a value of the reference voltage is indicative of the process corner information.

2. The method of claim 1, wherein controlling the at least one analog current comprises scaling down the at least one analog current if the process corner information is indicative of a fast corner IC.

3. The method of claim 2, further comprising scaling down the at least one analog current while a current consumption of digital circuitry of the IC increases.

4. The method of claim 2, further comprising not scaling down the at least one analog current if the process corner information is indicative of a slow corner IC.

5. The method of claim 1, wherein the reference voltage comprises a threshold voltage of at least one reference transistor of a reference circuit.

6. The method of claim 1, wherein controlling the at least one analog current comprises reducing the at least one analog current if the process corner information is indicative of a first process level.

7. The method of claim 6, wherein controlling the at least one analog current comprises not reducing the at least one analog current if the process corner information is indicative of a second process level, the second process level slower than the first process level.

8. The method of claim 1, further comprising reducing power dissipation of the IC by reducing the at least one analog current while operating digital circuitry of the IC at an increasing current level, the IC comprising a mixed signal circuit.

9. The method of claim 1, further comprising:
   digitizing the process corner information;
   switching a plurality of controllable impedances into a current source responsive to the digitized process corner information; and
   controlling the at least one analog current using the current source.

10. An integrated circuit (IC) comprising:
    at least one analog circuit;
    at least one digital circuit;
    a detector to determine process corner information of the IC; and
    a current generator to generate an analog current provided to the at least one analog circuit, wherein the current generator is to provide the analog current at a nominal level if the process corner information is indicative of a slow process corner and to provide the analog current at a reduced level if the process corner information is indicative of a fast process corner, wherein the at least one digital circuit is to consume greater power if the IC is of the fast process corner.

11. The integrated circuit of claim 10, wherein the detector comprises a reference circuit to output a reference voltage indicative of the process corner information, wherein the reference voltage comprises a threshold voltage of at least one reference transistor.

12. The integrated circuit of claim 11, wherein the detector further comprises:
    a digitizer to digitize the reference voltage; and
    an adjustable impedance, wherein an output of the adjustable impedance comprises a reference current.

13. The integrated circuit of claim 11, wherein the reference circuit comprises:
    a current source coupled to an output node;
    a first reference transistor having a first terminal coupled to the output node to provide the reference voltage, the first reference transistor having a second terminal coupled to a common node, the common node further coupled to a gate terminal of the first reference transistor; and
    a second reference transistor having a second terminal coupled to the common node, wherein the common node is further coupled to a gate terminal of the second reference transistor.

14. The integrated circuit of claim 10, wherein the current generator comprises a plurality of current mirrors to generate a plurality of analog currents, each of the plurality of current mirrors having a controllable ratio controlled by a digital control value representative of the process corner information.

15. A system comprising:

a tuner to receive an incoming radio frequency (RF) signal including content and to provide a tuned channel output, the tuner comprising a mixed signal device including a detector to determine process corner information of the mixed signal device, the detector comprising a reference circuit to output a reference voltage indicative of the process corner information, the reference voltage comprising a threshold voltage of at least one reference transistor, and a current generator to generate an analog current for at least one analog circuit of the mixed signal device, wherein the current generator is to provide the at least one analog current at a scaled level if the process corner information is indicative of a fast process corner;

a demodulator coupled to the tuner to demodulate the tuned channel output; and an output device coupled to the demodulator to provide the content corresponding to the demodulated tuned channel output.

16. The system of claim 15, wherein the detector further comprises:

a digitizer to digitize the reference voltage; and an adjustable impedance, wherein an output of the adjustable impedance comprises a reference current.

17. The system of claim 15, wherein the reference circuit comprises:

a current source coupled to an output node;

a first reference transistor having a first terminal coupled to the output node to provide the reference voltage, the first reference transistor having a second terminal coupled to a common node, the common node further coupled to a gate terminal of the first reference transistor; and a second reference transistor having a second terminal coupled to the common node, wherein the common node is further coupled to a gate terminal of the second reference transistor.

18. The system of claim 15, wherein the mixed signal device includes digital circuitry that consumes greater power at the fast process corner than at a slow process corner, wherein the detector and the current generator enable a reduced standard deviation for a power dissipation level of the tuner.

* * * * *